(12) United States Patent
Higuchi et al.

(10) Patent No.: US 12,035,460 B2
(45) Date of Patent: Jul. 9, 2024

(54) MOUNTING STRUCTURE FOR INDUCTORS

(71) Applicant: Murata Manufacturing Co., Ltd., Kyoto-fu (JP)

(72) Inventors: Tarou Higuchi, Nagaokakyo (JP); Yoshihiro Imanishi, Nagaokakyo (JP); Hiroyuki Honda, Nagaokakyo (JP); Akiko Sakane, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 62 days.

(21) Appl. No.: 18/056,187

(22) Filed: Nov. 16, 2022

(65) Prior Publication Data

US 2023/0097690 A1   Mar. 30, 2023

Related U.S. Application Data

(63) Continuation of application No. PCT/JP2021/016382, filed on Apr. 22, 2021.

(30) Foreign Application Priority Data

May 22, 2020   (JP) ................................ 2020-089503

(51) Int. Cl.
*H05K 1/02*   (2006.01)

(52) U.S. Cl.
CPC ..... *H05K 1/0233* (2013.01); *H05K 2201/093* (2013.01); *H05K 2201/09427* (2013.01); *H05K 2201/1003* (2013.01); *H05K 2201/10545* (2013.01)

(58) Field of Classification Search
CPC ............................ H05K 1/0233; H05K 1/023
See application file for complete search history.

(56) References Cited

FOREIGN PATENT DOCUMENTS

| JP | H08-250333 A | 9/1996 |
|----|--------------|--------|
| JP | 2002-110422 A | 4/2002 |
| JP | 2008-294269 A | 12/2008 |
| JP | 2016-152392 A | 8/2016 |
| JP | 2017-135142 A | 8/2017 |

OTHER PUBLICATIONS

International Search Report issued in PCT/JP2021/016382; mailed Jun. 22, 2021.

*Primary Examiner* — Jeremy C Norris
(74) *Attorney, Agent, or Firm* — Studebaker & Brackett PC

(57) ABSTRACT

A mounting structure for mounting inductors to suppress cross talk and a stub effect due to a mounting land, and reduce deterioration of signal transmission characteristics. A first Bias-T inductor is mounted on a circuit board with one electrode terminal connected to a first mounting land with an axial direction of the first Bias-T inductor oriented perpendicular to the first mounting land and the one electrode terminal extends along the first mounting land. A second Bias-T inductor is mounted on the circuit board in the vicinity of the first Bias-T inductor with one electrode terminal connected to a second mounting land with an axial direction of the second Bias-T inductor inclined by 90° with respect to the axial direction of the first Bias-T inductor and the second Bias-T inductor is oriented perpendicular to the second mounting land and the one electrode terminal extends along the second mounting land.

20 Claims, 11 Drawing Sheets

MOUNTING STRUCTURE FOR INDUCTORS

CROSS-REFERENCE TO RELATED APPLICATIONS

This application claims benefit of priority to International Patent Application No. PCT/JP2021/016382, filed Apr. 22, 2021, and to Japanese Patent Application No. 2020-089503, filed May 22, 2020, the entire contents of each are incorporated herein by reference.

BACKGROUND

Technical Field

The present disclosure relates to a mounting structure for inductors to a plurality of signal wiring patterns on a circuit board.

Background Art

A conventional signal transmission technology called PoC (Power over Coaxial) in which a signal and a DC bias power supply are superimposed on a single coaxial cable for communication exists. A signal transmission circuit using this technology uses a signal and power separation inductor called a Bias-T inductor. This inductor separates the signal propagating on the signal line from the DC bias power supply supplied from a bias supply source to the signal line.

Recently, many signals are being transmitted by this signal transmitting technology known as PoC, and as illustrated in a circuit block diagram in FIG. 1, signals transmitted by a plurality of coaxial cables 2 are input/output to/from one signal transmission IC 1. Thus, it is necessary to provide a Bias-T inductor 4 for each of a plurality of signal lines 3 connected to the one signal transmission IC 1, and a plurality of Bias-T inductors 4 are mounted on one circuit board 5 together with the signal transmission IC 1. One terminal of each Bias-T inductor 4 is connected to the signal line 3, and another terminal thereof is connected to a power supply line of the signal transmission IC 1. Each signal line 3 is connected to the signal transmission IC 1 via a capacitor 6 for cutting off DC power supply.

The Bias-T inductors 4 in the PoC signal transmission system, which includes two or more signal lines, are typically connected to the respective signal wiring patterns 3, which form the signal lines, in close proximity to each other and in the same orientation as illustrated in FIGS. 2A and 2B. In FIGS. 2A-2C, the same or equivalent parts as those in FIG. 1 are denoted by the same reference symbols. To avoid problems with component layout on the circuit board 5, the inductors 4 may be arranged at positions separated from each other as illustrated in FIG. 2C.

On the other hand, from the viewpoint of reduction in size of the circuit board 5, it is necessary to reduce the mounting area of the Bias-T inductors 4 on the circuit board 5 as much as possible. In this case, cross talk between the plurality of inductors 4 arranged close to each other becomes a problem.

To suppress such cross talk, Japanese Unexamined Patent Application Publication No. 8-250333 discloses a technique of arranging inductors in an inductor array in which a plurality of inductors are arranged side by side so that directions of magnetic flux flows of adjacent inductors are orthogonal to each other.

SUMMARY

When the inductors 4 are arranged close to each other as illustrated in FIGS. 2A and 2B, it is possible to make the mounting directions of the inductors 4 on the circuit board 5 orthogonal to each other as illustrated in FIG. 3 by applying the technique disclosed in Japanese Unexamined Patent Application Publication No. 8-250333. However, to arrange one inductor 4 orthogonal to another inductor 4, it is necessary to provide a mounting land 7 perpendicularly to the signal wiring pattern 3 and connect one electrode terminal of the inductor 4 to the mounting land 7. Accordingly, when these inductors 4 are used as signal and power separation inductors in a PoC signal transmission system and shunt-connected to the signal wiring patterns 3 for high-speed signal transmission as illustrated in FIG. 1, the mounting land 7 is connected to the signal wiring pattern 3 as a stub, which leads to a deterioration in signal transmission characteristics.

As another countermeasure for cross talk between the inductors, it is conceivable to use inductor components, each having a magnetic shield structure in which a coil winding is covered with a magnetic material. However, a size of the inductor component having the magnetic shield structure is increased by the shield structure covering the coil winding, thereby preventing reduction in size of the circuit board 5.

It is also conceivable to use inductor components, each having a closed magnetic circuit structure, such as a ferrite bead inductor molded with a magnetic material around the periphery thereof. The inductor components having a closed magnetic circuit structure can be reduced in size. However, inductor components having a closed magnetic circuit structure are not suitable for applications that transmit DC current in the PoC signal transmission system illustrated in FIG. 1 due to poor DC superposition characteristics thereof.

Accordingly, the present disclosure provides a mounting structure for inductors including a first signal wiring pattern having a first inclined side inclined at an angle of 22.5° to 67.5° with respect to an extension direction on one side in the extension direction and formed on a circuit board, a second signal wiring pattern having a second inclined side inclined at an angle of 22.5° to 67.5° with respect to the extension direction on another side in the extension direction and formed on the circuit board side by side with the first signal wiring pattern, a first mounting land formed along the first inclined side with one end being in contact with a corner at which the first signal wiring pattern extending in the extension direction and the first inclined side intersect, a first inductor mounted on the circuit board with one electrode terminal connected to the first mounting land in a state in which an axial direction of the first inductor is oriented perpendicular to the first mounting land and the one electrode terminal is arranged along the first mounting land, a second mounting land formed along the second inclined side with one end being in contact with a corner at which the second signal wiring pattern extending in the extension direction and the second inclined side intersect, and a second inductor mounted on the circuit board in the vicinity of the first inductor with one electrode terminal connected to the second mounting land in a state in which an axial direction of the second inductor is inclined at 90°±45° with respect to the axial direction of the first inductor and is oriented perpendicular to the second mounting land and the one electrode terminal is arranged along the second mounting land.

According to this configuration, the first inductor and the second inductor are mounted on the circuit board such that the angle formed by the axial directions thereof is 90°±45°. Thus, a flow direction of magnetic flux formed by the first inductor and a flow direction of magnetic flux formed by the second inductor are substantially orthogonal to each other.

Therefore, even when the first inductor and the second inductor are mounted close to each other on the circuit board, the magnetic flux formed by the first inductor and the magnetic flux formed by the second inductor are less likely to be coupled to each other, thereby suppressing the occurrence of cross talk.

The first inductor is mounted on the circuit board with the one electrode terminal connected to the first mounting land in a state in which the axial direction is oriented perpendicular to the first mounting land and the one electrode terminal is arranged along the first mounting land. The first mounting land is formed along the first inclined side such that the one end thereof is in contact with the corner at which the first signal wiring pattern extending in the extension direction and the first inclined side intersect.

Thus, the first inductor is mounted on the circuit board with the one electrode terminal along the first mounting land, and the first mounting land is formed along the first inclined side. Therefore, an amount by which a width of the first mounting land exceeds a width of the first inclined side is significantly suppressed and smaller than when the first mounting land is formed at right angles to the signal wiring pattern. Moreover, the first mounting land is formed such that the one end thereof is in contact with the corner at which the first signal wiring pattern and the first inclined side intersect. Therefore, the manner in which the width of the first mounting land exceeds the width of the first inclined side at the one end thereof is different from the manner in which the first mounting land formed along the straight portion of the first signal wiring pattern is excessive in a stepped manner in the straight portion of the first signal wiring pattern, and is a manner in which the one end of the wider first mounting land is obliquely in contact with the end portion of the first signal wiring pattern at that corner, so that the first mounting land and the first signal wiring pattern are continuous with a small width difference therebetween.

As a result, the stub effect of the first mounting land due to the width of the first mounting land being larger than the width of the first inclined side is suppressed, and the signal transmission characteristics are less likely to deteriorate even when the first inductor is shunt-connected to the first signal wiring pattern.

The second inductor is mounted on the circuit board with the one electrode terminal connected to the second mounting land in a state in which the axial direction is oriented perpendicular to the second mounting land and the one electrode terminal is arranged along the second mounting land. The second mounting land is formed along the second inclined side such that the one end thereof is in contact with the corner at which the second signal wiring pattern extending in the extension direction and the second inclined side intersect.

Therefore, similarly to the first mounting land, an amount by which a width of the second mounting land exceeds a width of the second inclined side is a small amount.

Moreover, the manner in which the width of the second mounting land exceeds the width of the second inclined side at the one end thereof is a manner in which the one end of the wider second mounting land is obliquely in contact with the end portion of the second signal wiring pattern at the corner at which the second signal wiring pattern and the second inclined side intersect, so that the second mounting land and the second signal wiring pattern are continuous with a small width difference therebetween. Thus, the stub effect of the second mounting land due to the width of the second mounting land being larger than the width of the second inclined side is also suppressed, and the signal transmission characteristics are less likely to deteriorate even when the second inductor is shunt-connected to the second signal wiring pattern.

The first inclined side is formed on the circuit board at the angle of 22.5° to 67.5° with respect to the extension direction on the one side of the first signal wiring pattern in the extension direction. The second inclined side is formed on the circuit board at the angle of 22.5° to 67.5° with respect to the extension direction on the other side of the second signal wiring pattern, which is formed side by side with the first signal wiring pattern, in the extension direction.

Thus, the inclination angles of the first inclined side and the second inclined side are set to the angles capable of suppressing deterioration of signal transmission characteristics of the high-frequency signals transmitted to the first signal wiring pattern and the second signal wiring pattern while the angle formed by the axial directions of the first inductor and the second inductor is maintained at 90°±45°. As a result, a mounting structure for inductors that can suppress the occurrence of cross talk without having a magnetic shield structure and that does not degrade the DC superposition characteristics due to having a closed magnetic circuit structure is provided.

The present disclosure constitutes a mounting structure for inductors including a first signal wiring pattern and a second signal wiring pattern formed on a circuit board side by side, a first mounting land formed in a formation direction of the first signal wiring pattern, a first inductor having an inductance value of 0.7 [μH] to 3.3 [μH], the first inductor being mounted on the circuit board with one electrode terminal connected to the first mounting land in a state in which an axial direction of the first inductor is oriented perpendicular to the first mounting land and the one electrode terminal is arranged along the first mounting land, a second mounting land formed in a formation direction of the second signal wiring pattern, and a second inductor having the same inductance value as the inductance value of the first inductor of 0.7 [μH] to 3.3 [μH], the second inductor being provided at a position separated from the first inductor by an axial distance of 2 mm to 8 mm and mounted on the circuit board with one electrode terminal connected to the second mounting land in a state in which an axial direction of the second inductor is oriented perpendicular to the second mounting land and the one electrode terminal is arranged along the second mounting land.

According to this configuration, the axial distance between the first inductor and the second inductor having the same inductance value of 0.7 [μH] to 3.3 [μH] is set to 2 [mm] to 8 [mm], and the one electrode terminal of the first inductor and the one electrode terminal of the second inductor are connected to the first mounting land and the second mounting land formed along the first signal wiring pattern and the second signal wiring pattern, respectively, so that the inductors can be mounted on the circuit board in a state in which the occurrence of cross talk and the stub effects due to the mounting lands are suppressed, and the signal transmission characteristics are less likely to deteriorate.

According to the present disclosure, even when a plurality of inductors are arranged close to each other, a mounting structure for inductors in which inductors can be mounted is provided in a state in which the occurrence of cross talk and the stub effects due to the mounting lands are suppressed, and signal transmission characteristics are less likely to deteriorate.

DETAILED DESCRIPTION

Next, embodiments for implementing a mounting structure for inductors according to the present disclosure will be described.

Figure 4:
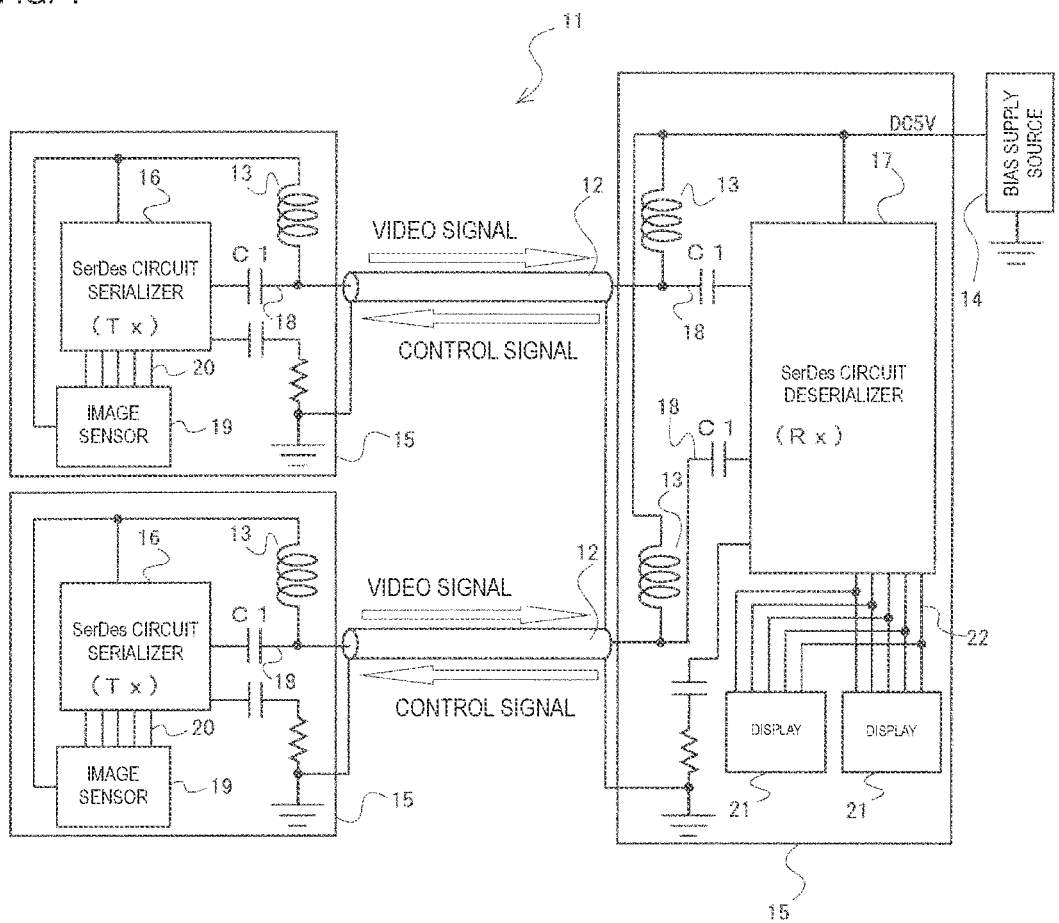
FIG. 4 is a block diagram illustrating a schematic configuration of a PoC signal transmission system to which the mounting structure for inductors according to a first embodiment of the present disclosure is applied.

FIG. 4 is a block diagram illustrating a schematic configuration of a PoC signal transmission system 11 to which a mounting structure for inductors according to a first embodiment of the present disclosure is applied.

The PoC signal transmission system 11 uses a PoC transmission technology that superimposes a signal and a DC bias power supply on a single signal line 12 using a coaxial cable. The PoC signal transmission system 11 uses a Bias-T inductor 13, which is a signal and power separation inductor, to separate a signal propagating through the signal line 12 from a DC bias power supply of DC 5 [V] supplied from a bias supply source 14 to the signal line 12. The Bias-T inductor 13 passes the DC bias power supply output from the bias supply source 14 to the signal line 12 while preventing signal leakage from the signal line 12.

In the PoC signal transmission system 11 according to the present embodiment, the signal lines 12 are wired between serializer/deserializer (SerDes) circuits 16 formed on circuit boards 15 on a controlled side and a SerDes circuit 17 formed on a circuit board 15 on a controlling side, respectively, and signals are transmitted to the signal lines 12. Each of the SerDes circuits 16 and the SerDes circuit 17 serialize parallel signals transmitted via a plurality of signal lines 20 and a plurality of signal lines 22 into serial signals and transmit the serial signals to one signal line 12, and deserialize the serial signals transmitted via the one signal line 12 into parallel signals and transmit the parallel signals to the plurality of signal lines 20 and the plurality of signal lines 22.

The DC bias power supply output from the bias supply source 14 is directly supplied to the SerDes circuit 17 and also propagates through the signal lines 12 through the Bias-T inductors 13 on the SerDes circuit 17 side. The DC bias power supply propagated through each signal line 12 is separated from each signal line 12 and supplied to each SerDes circuit 16 through each Bias-T inductor 13 on the SerDes circuit 16 side. A capacitor C1 is connected in series between each SerDes circuit 16 and the signal line 12 and between the SerDes circuit 17 and the signal line 12, and each capacitor C1 prevents the DC bias power supply propagating through the signal line 12 from being input to each of the SerDes circuits 16 and 17. High-frequency signals propagating through the signal lines 12 are transmitted to the SerDes circuits 16 and 17 via the respective capacitors C1. Each Bias-T inductor 13 is connected to each signal wiring pattern 18 between a coaxial cable connector (not illustrated) provided at an end portion of the signal line 12 and the capacitor C1. The ideal impedance frequency characteristics of each Bias-T inductor 13 show 0 [Ω] with DC and high impedance at high frequencies.

For example, an image sensor 19 of a dashboard camera is connected to each SerDes circuit 16 on the controlled side via the plurality of signal lines 20, and each SerDes circuit 16 serializes broadband video signals input from the image sensor 19 via the plurality of signal lines 20 and transmits the video signals to each signal line 12. At this time, each SerDes circuit 16 functions as a serializer circuit and serves as a transmitter (Tx) that converts parallel signals into serial signals and outputs the serial signals.

For example, each display 21 mounted in the vehicle is connected to the SerDes circuit 17 on the controlling side via the plurality of signal lines 22, and the SerDes circuit 17 deserializes the serial video signals transmitted from each SerDes circuit 16 via each signal line 12 and outputs the deserialized video signals to each display 21 via the plurality of signal lines 22. At this time, the SerDes circuit 17 functions as a deserializer circuit and the receiver (Rx) that receives the serial signal and converts the received serial signals into the original parallel signals.

A control signal is propagated in a reverse direction through each signal line 12 from the SerDes circuit 17 to each SerDes circuit 16 side, and each image sensor 19 is controlled by the circuit on the display 21 side. At this time, the SerDes circuit 17 functions as a serializer circuit and serves as a transmitter (Tx) that converts parallel signals into serial signals and outputs the serial signals. In addition, each SerDes circuit 16 functions as a deserializer circuit and serves as a receiver (Rx) that converts the serial signals into the original parallel signals and receives the parallel signals.

Figure 5A:
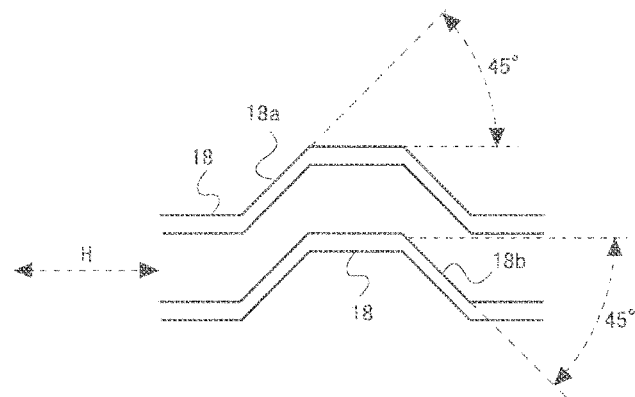
FIGS. 5A-5C are plan views illustrating a preferred configuration of the mounting structure for inductors according to the first embodiment.
Figure 5B:
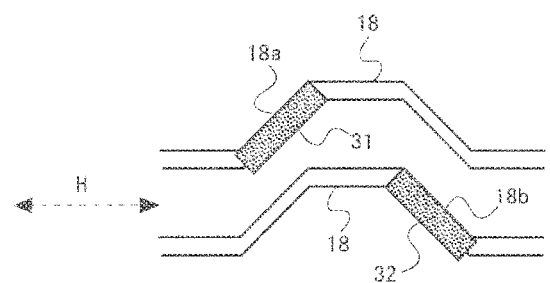
Figure 5C:
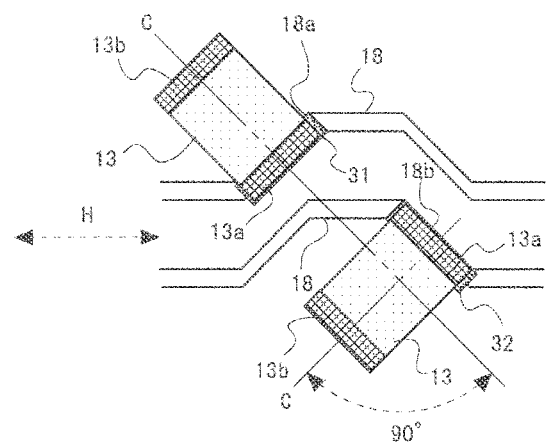

FIGS. 5A-5C are plan views illustrating a mounting structure for inductors according to the first embodiment of the present disclosure on the circuit board 15 on the controlling side on which two Bias-T inductors 13 are mounted and illustrates a structure in which the Bias-T inductors 13 with their axial directions C orthogonal to each other are mounted on the signal wiring patterns 18. FIG. 5A illustrates shapes of the signal wiring patterns 18 before mounting the Bias-T inductors 13, FIG. 5B illustrates a state in which a first mounting land 31 and a second mounting land 32 are formed on the respective signal wiring patterns 18, and FIG. 5C illustrates a state in which the Bias-T inductors 13 are mounted on the circuit board 15.

As illustrated in FIG. 5A, a first signal wiring pattern 18 located in the upper part of the figure is formed on the circuit board 15 so as to have a first inclined side 18a inclined at an angle of 45° with respect to an extension direction H on one side in the extension direction H. A second signal wiring pattern 18 located in the lower part of the figure is formed on the circuit board 15 side by side with the first signal wiring pattern 18 so as to have a second inclined side 18b inclined at an angle of 45° with respect to the extension direction H on another side in the extension direction H.

As illustrated in FIG. 5B, the first mounting land 31 is formed on the first inclined side 18a along the first inclined side 18a. One end of the first mounting land 31 is in contact with a corner at which the first signal wiring pattern 18 extending in the extension direction H and the first inclined side 18a intersect. The second mounting land 32 is formed on the second inclined side 18b along the second inclined side 18b. One end of the second mounting land 32 is in contact with a corner at which the second signal wiring pattern 18 extending in the extension direction H and the second inclined side 18b intersect.

As illustrated in FIG. 5C, the first Bias-T inductor 13 located in the upper part of the figure is mounted on the circuit board 15 with one electrode terminal 13a connected to the first mounting land 31 in a state in which the axial direction C of the first Bias-T inductor 13 is oriented perpendicular to the first mounting land 31 and the one electrode terminal 13a is arranged along the first mounting land 31. Specifically, the axial direction C of the first Bias-T inductor 13 is oriented perpendicular to a formation direction of the first mounting land 31, and a formation direction of the one electrode terminal 13a is aligned with the formation direction of the first mounting land 31. Here, the formation direction of the first mounting land 31 is a direction in which the first mounting land 31 having a rectangular shape extends, and is parallel to a long side of the rectangular shape. Similarly, the formation direction of the electrode terminal 13a is a direction in which the electrode terminal 13a having a rectangular shape extends, and is parallel to a long side of the rectangular shape.

The second Bias-T inductor 13 located in the lower part of the figure is mounted on the circuit board 15 in the vicinity of the first Bias-T inductor 13 with one electrode terminal 13a connected to the second mounting land 32 in a state in which the axial direction C of the second Bias-T inductor 13 is inclined at 90° with respect to the axial direction C of the first Bias-T inductor 13 and oriented perpendicular to the second mounting land 32 and the one electrode terminal 13a is arranged along the second mounting land 32. Specifically, the axial direction C of the second Bias-T inductor 13 is oriented perpendicular to a formation direction of the second mounting land 32, and a formation direction of the one electrode terminal 13a is aligned with the formation direction of the second mounting land 32. Here, the formation direction of the second mounting land 32 is a direction in which the second mounting land 32 having a rectangular shape extends, and is parallel to a long side of the rectangular shape. Other electrode terminals 13b of the first and second Bias-T inductors 13 are connected to the power supply line as illustrated in FIG. 4.

Figure 6A:
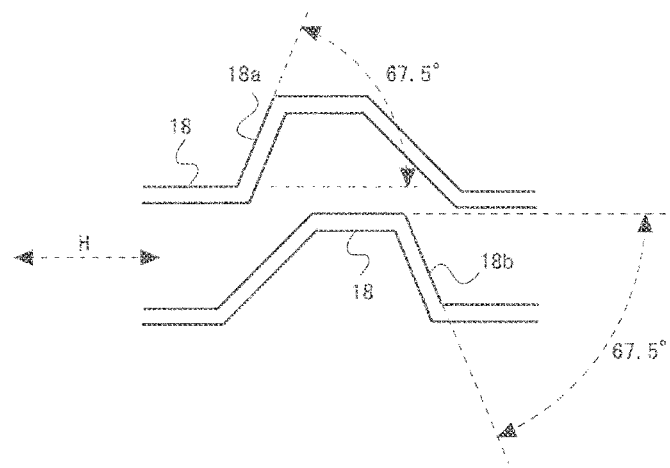
FIGS. 6A-6C are plan views illustrating an allowable first configuration of the mounting structure for inductors according to the first embodiment.
Figure 6B:
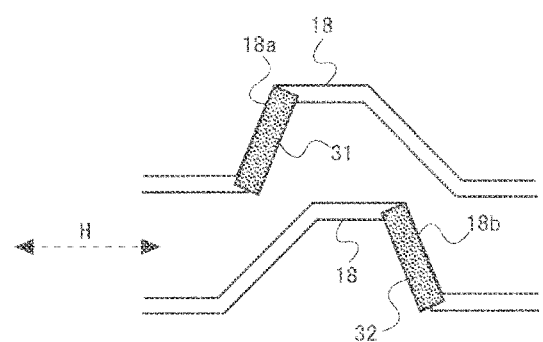
Figure 6C:
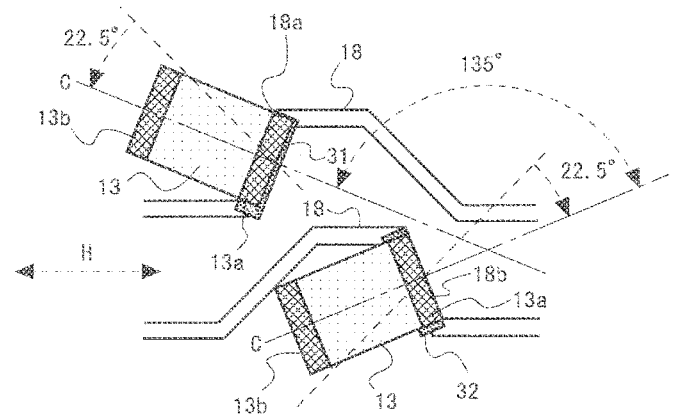

FIGS. 6A-6C illustrates a mounting structure for inductors according to the first embodiment of the present disclosure in a state in which an angle formed by the axial directions C of the Bias-T inductors 13 is 90°+45° (=135°) in response to rotating the axial directions C of the Bias-T inductors 13 by 22.5° in directions away from each other, in the mounting structure for inductors illustrated in FIGS. 5A-5C in which the axial directions C of the Bias-T inductors 13 are orthogonal to each other. In the mounting structure for inductors according to the first embodiment of the present disclosure, the angle formed by the axial directions C of the Bias-T inductors 13 is 90°+45° (=135°) at the maximum as illustrated in FIGS. 6A-6C. FIG. 6A illustrates shapes of the signal wiring patterns 18 used in this state before mounting the Bias-T inductors 13, FIG. 6B illustrates a state in which the first mounting land 31 and the second mounting land 32 are formed on the respective signal wiring patterns 18 illustrated in FIG. 6A, and FIG. 6C illustrates a state in which the Bias-T inductors 13 are mounted on the mounting lands 31 and 32 illustrated in FIG. 6B, respectively.

As illustrated in FIG. 6A, the first inclined side 18a of the first signal wiring pattern 18 located in the upper part of the figure is inclined at an angle of 67.5° at the maximum with respect to the extension direction H on the one side in the extension direction H. The second inclined side 18b of the second signal wiring pattern 18 located in the lower side in the figure is inclined at an angle of 67.5° at the maximum with respect to the extension direction H on the other side in the extension direction H.

As illustrated in FIG. 6B, the first mounting land 31 is formed on the first inclined side 18a along the first inclined side 18a. Also in this case, the one end of the first mounting land 31 is in contact with the corner at which the first signal wiring pattern 18 extending in the extension direction H and the first inclined side 18a intersect. The second mounting land 32 is formed on the second inclined side 18b along the second inclined side 18b. Also in this case, the one end of the second mounting land 32 is in contact with the corner at which the second signal wiring pattern 18 extending in the extension direction H and the second inclined side 18b intersect.

As illustrated in FIG. 6C, the axial direction C of the first Bias-T inductor 13, which is located in the upper part of the figure, is inclined counterclockwise by 22.5° at the maximum from the state illustrated in FIG. 5C. Also at this time, the first Bias-T inductor 13 is mounted on the circuit board 15 with the one electrode terminal 13a connected to the first mounting land 31 in a state in which the axial direction C of the first Bias-T inductor 13 is oriented perpendicular to the first mounting land 31 and the one electrode terminal 13a is arranged along the first mounting land 31. The axial direction C of the second Bias-T inductor 13, which is located in the lower part of the figure, is inclined clockwise by 22.5° at the maximum from the state illustrated in FIG. 5C. Thus, the axial direction C of the second Bias-T inductor 13 is inclined at 90°+45° (=135°) at the maximum with respect to the axial direction C of the first Bias-T inductor 13. Also at this time, the second Bias-T inductor 13 is mounted on the circuit board 15 in the vicinity of the first Bias-T inductor 13 with the one electrode terminal 13a connected to the second mounting land 32 in a state in which the axial direction C of the second Bias-T inductor 13 is oriented perpendicular to the second mounting land 32 and the one electrode terminal 13a is arranged along the second mounting land 32.

Figure 7A:
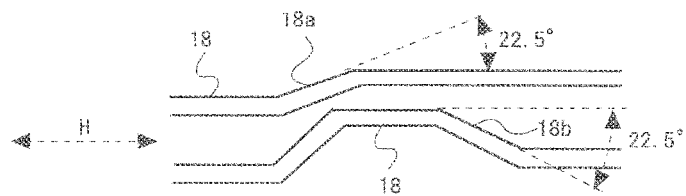
FIGS. 7A-7C are plan views illustrating an allowable second configuration of the mounting structure for inductors according to the first embodiment.
Figure 7B:
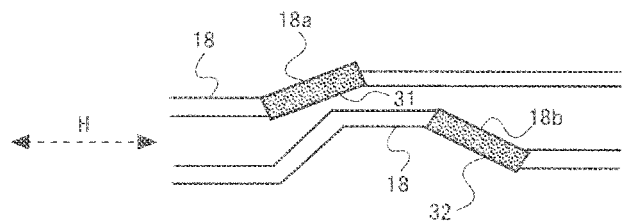
Figure 7C:
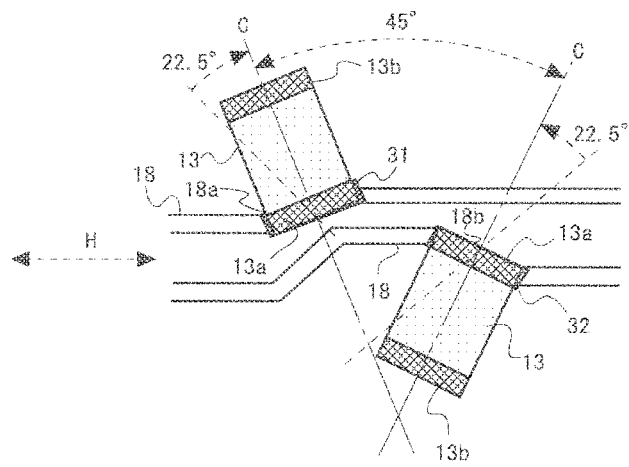

FIGS. 7A-7C illustrate a mounting structure for inductors according to the first embodiment of the present disclosure in a state in which the angle formed by the axial directions C of the Bias-T inductors 13 is 90°−45° (=45°) in response to rotating the axial directions C of the Bias-T inductors 13 by 22.5° in directions close to each other, in the mounting structure for inductors illustrated in FIGS. 5A-5C in which the axial directions C of the Bias-T inductors 13 are orthogonal to each other. In the mounting structure for inductors according to the first embodiment of the present disclosure, the angle formed by the axial directions C of the Bias-T inductors 13 is 90°−45° (=45°) at the minimum as illustrated in FIGS. 7A-7C. FIG. 7A illustrates shapes of the signal wiring patterns 18 used in this state before mounting the Bias-T inductors 13, FIG. 7B illustrates a state in which the first mounting land 31 and the second mounting land 32 are formed on the respective signal wiring patterns 18 illustrated in FIG. 7A, and FIG. 7C illustrates a state in which the Bias-T inductors 13 are mounted on the mounting lands 31 and 32 illustrated in FIG. 7B, respectively.

As illustrated in FIG. 7A, the first inclined side 18a of the first signal wiring pattern 18 located in the upper part of the figure is inclined at an angle of 22.5° at the minimum with respect to the extension direction H on the one side in the extension direction H. The second inclined side 18b of the second signal wiring pattern 18 located in the lower side in the figure is inclined at an angle of 22.5° at the minimum with respect to the extension direction H on the other side in the extension direction H.

As illustrated in FIG. 7B, the first mounting land 31 is formed on the first inclined side 18a along the first inclined side 18a. Also in this case, the one end of the first mounting land 31 is in contact with the corner at which the first signal wiring pattern 18 extending in the extension direction H and the first inclined side 18a intersect. The second mounting land 32 is formed on the second inclined side 18b along the second inclined side 18b. Also in this case, the one end of the second mounting land 32 is in contact with the corner at which the second signal wiring pattern 18 extending in the extension direction H and the second inclined side 18b intersect.

As illustrated in FIG. 7C, the axial direction C of the first Bias-T inductor 13, which is located in the upper part of the figure, is inclined clockwise by 22.5° at the maximum from the state illustrated in FIG. 5C. Also at this time, the first Bias-T inductor 13 is mounted on the circuit board 15 with the one electrode terminal 13a connected to the first mounting land 31 in a state in which the axial direction C of the first Bias-T inductor 13 is oriented perpendicular to the first mounting land 31 and the one electrode terminal 13a is arranged along the first mounting land 31. The axial direction C of the second Bias-T inductor 13, which is located in the lower part of the figure, is inclined counterclockwise by 22.5° at the maximum from the state illustrated in FIG. 5C. Thus, the axial direction C of the second Bias-T inductor 13 is inclined at 90°−45° (=45°) at the minimum with respect to the axial direction C of the first Bias-T inductor 13. Also at this time, the second Bias-T inductor 13 is mounted on the circuit board 15 in the vicinity of the first Bias-T inductor 13 with the one electrode terminal 13a connected to the second mounting land 32 in a state in which the axial direction C of the second Bias-T inductor 13 is oriented perpendicular to the second mounting land 32 and the one electrode terminal 13a is arranged along the second mounting land 32.

According to the mounting structure for inductors of the present embodiment, the first Bias-T inductor 13 and the second Bias-T inductor 13 are mounted on the circuit board 15 such that the angle formed by the axial directions C of the first Bias-T inductor 13 and the second Bias-T inductor 13 is within a range of 90°±45°. Thus, a flow direction of magnetic flux formed by the first Bias-T inductor 13 and a flow direction of magnetic flux formed by the second Bias-T inductor 13 are substantially orthogonal to each other. Therefore, even when the first Bias-T inductor 13 and the second Bias-T inductor 13 are mounted close to each other on the circuit board 15, the magnetic flux formed by the first Bias-T inductor 13 and the magnetic flux formed by the second Bias-T inductor 13 are less likely to be coupled to each other, thereby suppressing the occurrence of cross talk.

The first Bias-T inductor 13 is mounted on the circuit board 15 with the one electrode terminal 13a connected to the first mounting land 31 in a state in which the axial direction C is oriented perpendicular to the first mounting land 31 and the one electrode terminal 13a is arranged along the first mounting land 31. The first mounting land 31 is formed along the first inclined side 18a such that the one end thereof is in contact with the corner at which the first signal wiring pattern 18 extending in the extension direction H and the first inclined side 18a intersect.

Figure 3:
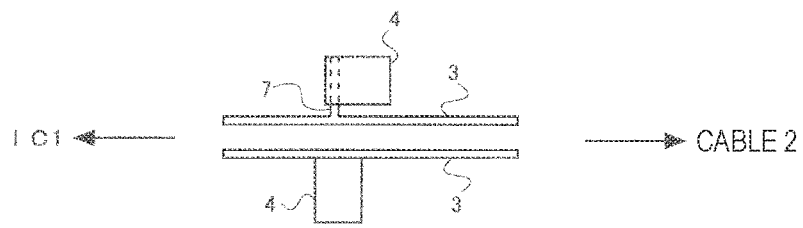
FIG. 3 is a plan view illustrating a mounting structure for inductors obtained by applying a conventional technology to a typical mounting structure for inductors in the PoC signal transmission system including two or more signal lines.

Thus, the first Bias-T inductor 13 is mounted on the circuit board 15 with the one electrode terminal 13a along the first mounting land 31, and the first mounting land 31 is formed along the first inclined side 18a. Therefore, an amount by which a width of the first mounting land 31 exceeds a width of the first inclined side 18a is significantly suppressed and smaller than when the mounting land 7 is formed at right angles to the straight signal wiring pattern 3 as illustrated in FIG. 3. Moreover, the first mounting land 31 is formed such that the one end thereof is in contact with the corner at which the first signal wiring pattern 18 and the first inclined side 18a intersect.

Figure 8A:
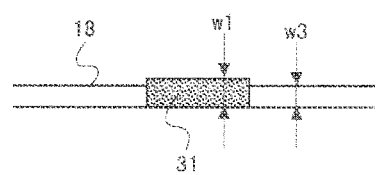
FIGS. 8A and 8B are diagrams for explaining that a stub effect is suppressed in the mounting structure for inductors according to the first embodiment.
Figure 8B:
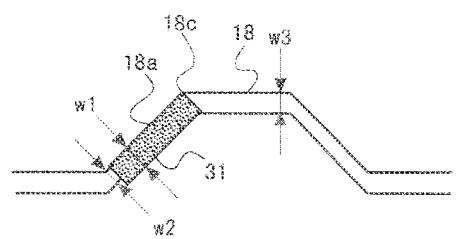

Therefore, a manner in which a width w1 of the first mounting land 31 exceeds, at the one end thereof, a width w2 of the first inclined side 18a as illustrated in FIG. 8B is different from a manner in which the width w1 of the first mounting land 31 formed along the straight portion of the first signal wiring pattern 18 exceeds, at both ends of the first mounting land 31, a width w3 of the first signal wiring pattern 18 in a stepped manner in the straight portion of the first signal wiring pattern 18 as illustrated in FIG. 8A. That is, as illustrated in FIG. 8B, at a corner 18c at which the first signal wiring pattern 18 and the first inclined side 18a intersect, the one end of the first mounting land 31 that is wider than the width w3 of the first signal wiring pattern 18 is obliquely in contact with one end portion of the first signal wiring pattern 18, so that the first mounting land 31 and the first signal wiring pattern 18 are continuous with a small width difference therebetween.

As a result, the stub effect of the first mounting land 31 due to the width w1 of the first mounting land 31 being larger than the width w2 of the first inclined side 18a is suppressed, and the signal transmission characteristics are less likely to deteriorate even when the first Bias-T inductor 13 is shunt-connected to the first signal wiring pattern 18 as illustrated in FIG. 4.

Figure 9A:
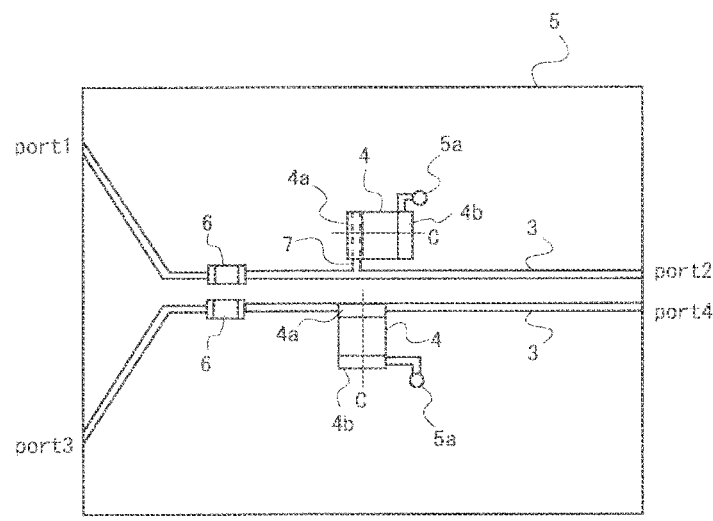
FIG. 9A is a board mounting diagram when measuring signal transmission characteristics in the mounting structure for inductors illustrated in FIG. 3 obtained by applying the conventional technology.

On the other hand, in the mounting structure for inductors illustrated in FIG. 3, the signal transmission characteristics deteriorate easily. For example, as illustrated in FIG. 9A, the signal wiring patterns 3 for high-speed signal transmission are formed on the circuit board 5, and the mounting directions of the inductors 4 on the circuit board 5 are orthogonal to each other, thereby forming the mounting structure for inductors illustrated in FIG. 3. Measurement of the signal transmission characteristics in that configuration yields the results shown in the graph in FIG. 9B.

One terminal 4a of the inductor 4, which is located in the upper part of FIG. 9A and arranged such that an axial direction C is parallel to an extension direction of the signal wiring pattern 3, is connected to the mounting land 7 formed at right angles to the signal wiring pattern 3. Another terminal 4b is connected via a through-hole 5a to a ground pattern formed in an inner layer of the circuit board 5 and extending over an entire large area. One terminal 4a of the inductor 4, which is located at the lower part of FIG. 9A and arranged such that an axial direction C is perpendicular to the extension direction of the signal wiring pattern 3, is connected to a mounting land (not illustrated) formed along the signal wiring pattern 3. Another terminal 4b is connected to the ground pattern formed in the inner layer of the circuit board 5 via a through-hole 5a. Capacitors 6 for cutting off DC power are provided between the one terminals 4a of the inductors 4 and ports 1 and 3, respectively.

Figure 9B:
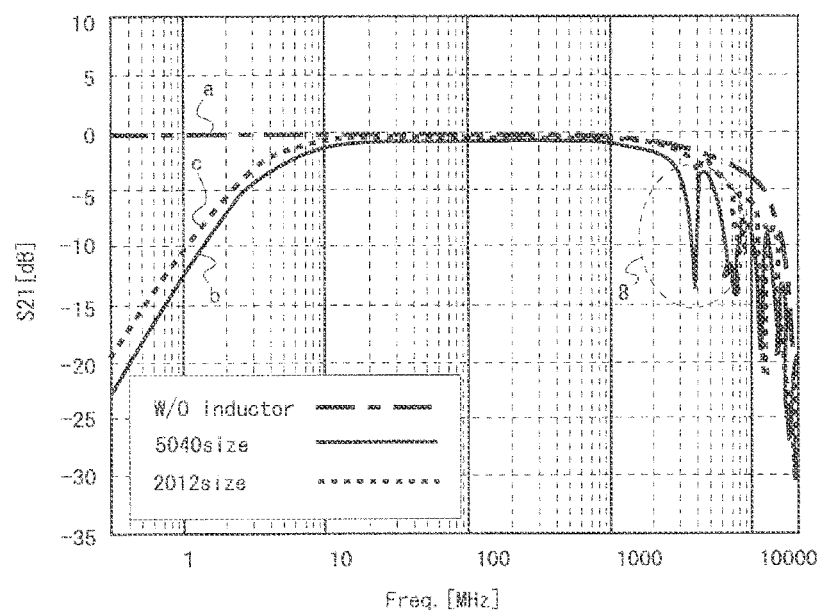
FIG. 9B is a graph showing results of measuring the signal transmission characteristics.

A signal transmission characteristic S21 in such a mounting structure for inductors deteriorates in a high-frequency region of the signal as shown in the graph in FIG. 9B. This is considered to be because the mounting land 7 formed at right angles to the signal wiring pattern 3 acts as a stub. In the graph, the horizontal axis represents the frequency [MHz], and the vertical axis represents the transmission characteristic S21 [dB]. The transmission characteristic S21 is a characteristic of a signal input to the port 1 that passes through a port 2, and represents an insertion loss. A characteristic line a represents a characteristic when both inductors 4 are not mounted (no inductors), a characteristic line b represents a characteristic when both inductors 4 are 5040-size inductors having a long side of 5 [mm] and a short side of 4 [mm], and a characteristic line c represents a characteristic when both inductors 4 are 2012-size inductors having a long side of 2 [mm] and a short side of 1.2 [mm]. The transmission characteristic S21 is particularly worse for the larger 5040-size inductor 4 indicated by the characteristic line b than for the smaller 2012-size inductor 4 indicated by the characteristic line c, in the high-frequency region indicated by a dotted ellipse 8.

As illustrated in FIGS. 5A to 7C, the second Bias-T inductor 13 according to the present embodiment is mounted on the circuit board 15 with the one electrode terminal 13a connected to the second mounting land 32 in a state in which the axial direction C is oriented perpendicular to the second mounting land 32 and the one electrode terminal 13a is arranged along the second mounting land 32. The second mounting land 32 is formed along the second inclined side 18b such that the one end thereof is in contact with the corner at which the second signal wiring pattern 18 extending in the extension direction H and the second inclined side 18b intersect.

Therefore, similarly to the first mounting land 31 described above, an amount by which a width of the second mounting land 32 exceeds a width of the second inclined side 18b is a small amount. Moreover, the manner in which the width of the second mounting land 32 exceeds the width of the second inclined side 18b at the one end thereof is a manner in which the one end of the second mounting land 32 that is wider than the width of the second signal wiring pattern 18 is obliquely in contact with the end portion of the second signal wiring pattern 18 at the corner at which the second signal wiring pattern 18 and the second inclined side 18b intersect, so that the second mounting land 32 and the second signal wiring pattern 18 are continuous with a small width difference therebetween, as in the case illustrated in FIG. 8B. Therefore, the stub effect of the second mounting land 32 due to the width of the second mounting land 32 being larger than the width of the second inclined sides 18b is also suppressed, and the signal transmission characteristics are less likely to deteriorate even when the second Bias-T inductor 13 is shunt-connected to the second signal wiring pattern 18 as illustrated in FIG. 4.

The first inclined side 18a is formed on the circuit board 15 at the angle of 22.5° to 67.5° with respect to the extension direction H on the one side of the first signal wiring pattern 18 in the extension direction H. The second inclined side 18b is formed on the circuit board 15 at the angle of 22.5° to 67.5° with respect to the extension direction H on the other side of the second signal wiring pattern 18, which is formed side by side with the first signal wiring pattern 18, in the extension direction H.

Thus, the inclination angles of the first inclined side 18a and the second inclined side 18b are set to the angles capable of suppressing deterioration of signal transmission characteristics of the high-frequency signals transmitted to the first signal wiring pattern 18 and the second signal wiring pattern 18 while the angle formed by the axial directions C of the first Bias-T inductor 13 and the second Bias-T inductor 13 is maintained at 90°±45°. As a result, a mounting structure for inductances that can suppress the occurrence of cross talk without having a magnetic shield structure and that does not degrade the DC superposition characteristics due to having a closed magnetic circuit structure is provided.

According to the mounting structure for inductors in which the Bias-T inductors 13 are orthogonal to each other illustrated in FIGS. 5A-5C, the flow direction of the magnetic flux formed by the first Bias-T inductor 13 and the flow direction of the magnetic flux formed by the second Bias-T inductor 13 are orthogonal to each other. Therefore, even when the first Bias-T inductor 13 and the second Bias-T inductor 13 are mounted close to each other on the circuit board 15, the magnetic flux formed by the first Bias-T inductor 13 and the magnetic flux formed by the second Bias-T inductor 13 are less likely to be coupled to each other, thereby further suppressing the occurrence of cross talk. Further, the inclination angles of 45° of the first inclined side 18a and the second inclined side 18b are set to the angles capable of further suppressing, as compared to when the inclination angles are 45° or more as illustrated in FIGS. 6A-6C, deterioration of the signal transmission characteristics of the high-frequency signals transmitted to the first signal wiring pattern 18 and the second signal wiring pattern 18 while the angle formed by the axial directions C of the first Bias-T inductor 13 and the second Bias-T inductor 13 is maintained at 90°.

Figure 10:
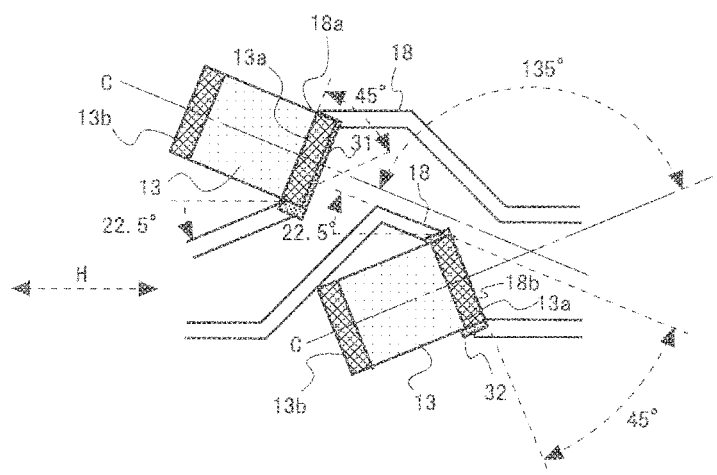
FIG. 10 is a plan view illustrating the mounting structure for inductors according to the first embodiment in which the signal wiring patterns in the mounting structure for inductors illustrated in FIGS. 6A-6C are changed to a preferable state.

In terms of high-frequency design, an angle of a bent portion or curved portion in the signal wiring pattern 18, that is, the inclination angles of the first inclined side 18a and the second inclined side 18b, are preferably 45° or less as illustrated in FIGS. 5A-5C and 7A-7C. Thus, also in the mounting structure for inductors illustrated in FIGS. 6A-6C, as illustrated in FIG. 10, it is desirable to set the angle formed by the first wiring pattern 18 and the first inclined side 18a to 45° by inclining the first wiring pattern 18 located in the upper part of the figure by 22.5° in the counterclockwise direction. Further, it is desirable to set the angle formed by the second wiring pattern 18 and the second inclined side 18b to 45° by inclining the second wiring pattern 18 located in the lower part of the figure by 22.5° in the clockwise direction. In FIG. 10, the same or equivalent parts as those in FIGS. 6A-6C are denoted by the same reference symbols, and description thereof will be omitted.

In the mounting structure for inductors according to the first embodiment, the circuit board 15 may be formed as a double-sided board in which a ground layer is formed as an inner layer and components are mounted on both sides, and the first signal wiring pattern 18, the second signal wiring pattern 18, the first mounting land 31, the second mounting land 32, the first Bias-T inductor 13, and the second Bias-T inductor 13, which form the mounting structure for inductors, may be formed on respective both sides of the circuit board 15.

Figure 1:
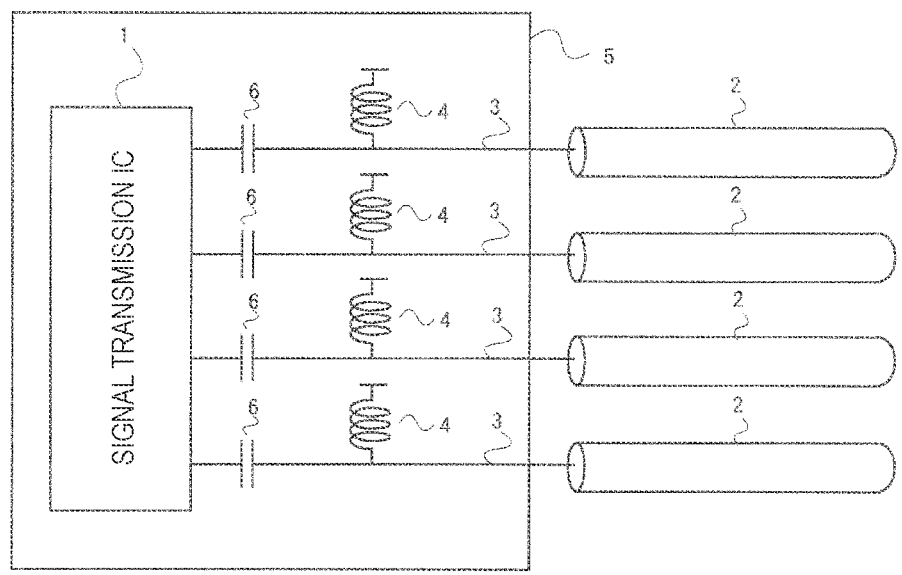
FIG. 1 is a block diagram of a typical PoC signal transmission system including two or more signal lines.
Figure 2A:
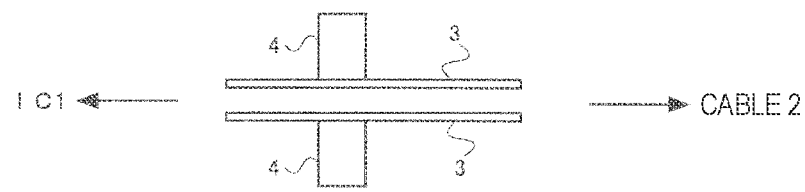
FIGS. 2A-2C are plan views illustrating a typical mounting structure for inductors in the PoC signal transmission system including two or more signal lines.
Figure 2B:
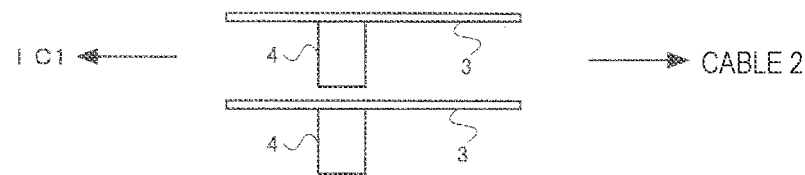
Figure 2C:
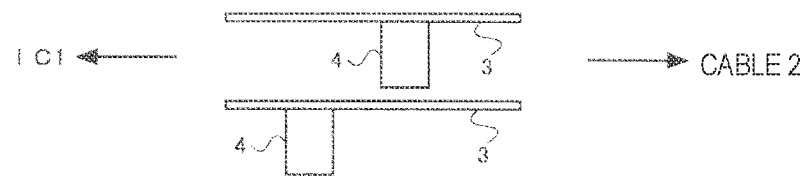

According to such a configuration of a first modification of the first embodiment, the mounting structures for the inductors to the plurality of signal wiring patterns 18 are configured on both sides of the circuit board 15 in which the occurrence of cross talk between the first Bias-T inductor 13 and the second Bias-T inductor 13 and the stub effects due to the mounting lands 31 and 32 are suppressed, and deterioration of the signal transmission characteristics is less likely to occur. In the mounting structures for the inductors formed on respective both sides of the circuit board 15, cross talk between the Bias-T inductors 13 on one side and the Bias-T inductors 13 on another side is reduced by the ground layer formed over the entire area of the inner layer of the circuit board 15. Thus, by effectively utilizing both the front side and the back side of the circuit board 15, the mounting structures of more Bias-T inductors 13 with the above-described effects are formed on the circuit board 15 having the same size, so that the mounting structures of more Bias-T inductors 13 with the above-described effects can be obtained while reducing the size of the circuit board 15 also for the four signal lines as illustrated in FIG. 1.

In the mounting structures for inductors according to the first embodiment and the first modification, a case in which the Bias-T inductors 13 are connected to two signal wiring patterns 18 is described. However, more Bias-T inductors 13 may be connected to more signal wiring patterns 18.

Figure 11:
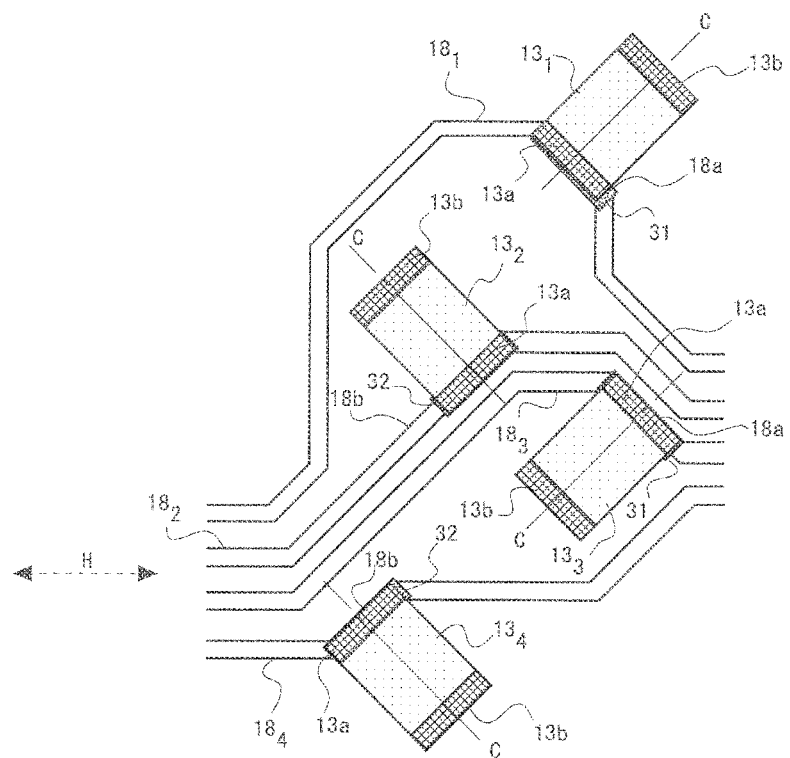
FIG. 11 is a plan view illustrating a mounting structure for inductors according to a second modification of the first embodiment.

FIG. 11 is a plan view illustrating a mounting structure for inductors according to a second modification of the first embodiment described above, in which four Bias-T inductors $13_1$, $13_2$, $13_3$, and $13_4$ are connected to four signal wiring patterns $18_1$, $18_2$, $18_3$, and $18_4$. In FIG. 11, the same or equivalent parts as those in FIGS. 5A to 7C are denoted by the same reference symbols, and description thereof will be omitted.

The mounting structure for inductors according to the second modification is different from the mounting structure for inductors according to the first embodiment only in that four Bias-T inductors $13_1$, $13_2$, $13_3$, and $13_4$ are connected to four signal wiring patterns $18_1$, $18_2$, $18_3$, and $18_4$. The configuration in which the two Bias-T inductors $13_1$ and $13_2$ are connected to the two signal wiring patterns $18_1$ and $18_2$ is similar to the mounting structure for inductors in the first embodiment described above in which the first and second Bias-T inductors 13 and 13 are connected to the first and second signal wiring patterns 18 and 18.

That is, the mounting structure for inductors according to the second modification includes the third signal wiring pattern $18_3$ having a third inclined side 18a inclined at an angle of 22.5° to 67.5° with respect to the extension direction H on the one side in the extension direction H and formed on the circuit board 15 side by side with the second signal wiring pattern $18_2$, and the fourth signal wiring pattern $18_4$ having a fourth inclined side 18b inclined at an angle of 22.5° to 67.5° with respect to the extension direction H on the other side in the extension direction H and formed on the circuit board 15 side by side with the third signal wiring pattern $18_3$.

A third mounting land 31 is formed on the third inclined side 18a along the third inclined side 18a. The third mounting land 31 is formed such that one end thereof is in contact with a corner at which the third signal wiring pattern $18_3$ extending in the extension direction H and the third inclined side 18a intersect. The third Bias-T inductor $13_3$ is mounted on the circuit board 15 in the vicinity of the second Bias-T inductor $13_2$ with one electrode terminal 13a connected to the third mounting land 31 in a state in which an axial direction C is inclined at 90°±45° with respect to the axial direction of the second Bias-T inductor $13_2$ and oriented perpendicular to the third mounting land 31 and the one electrode terminal 13a is arranged along the third mounting land 31.

A fourth mounting land 32 is formed on the fourth inclined side 18b along the fourth inclined side 18b. The fourth mounting land 32 is formed such that one end thereof is in contact with a corner at which the fourth signal wiring pattern $18_4$ extending in the extension direction H and the fourth inclined side 18b intersect. The fourth Bias-T inductor $13_4$ is mounted on the circuit board 15 in the vicinity of the third Bias-T inductor $13_3$ with one electrode terminal 13a connected to the fourth mounting land 32 in a state in which an axial direction C is inclined at 90°±45° with respect to the axial direction C of the third Bias-T inductor $13_3$ and oriented perpendicular to the fourth mounting land 32 and the one electrode terminal 13a is arranged along the fourth mounting land 32.

According to such a configuration of the second modification of the first embodiment, the third and fourth Bias-T inductors $13_3$ and $13_4$ can be mounted, side by side with the first and second Bias-T inductors $13_1$ and $13_2$, on the third and fourth signal wiring patterns $18_3$ and $18_4$ arranged side by side with the first and second signal wiring patterns $18_1$ and $18_2$ in a state in which the occurrence of cross talk and the stub effects due to the mounting lands 31 and 32 are suppressed and deterioration of signal transmission characteristics is less likely to occur. Further, by extending this idea, also when Bias-T inductors 13 are mounted on four or more signal wiring patterns 18, respectively, by similarly applying the present technology, a mounting structure for inductors with similar operation and effect can be provided.

Figure 12A:
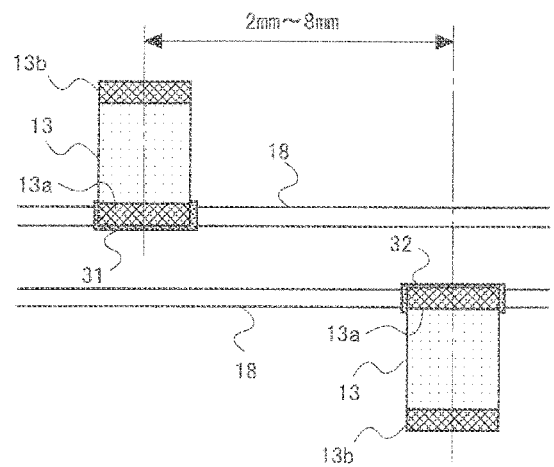
FIGS. 12A and 12B are plan views illustrating a mounting structure for inductors according to a second embodiment of the present disclosure.
Figure 12B:
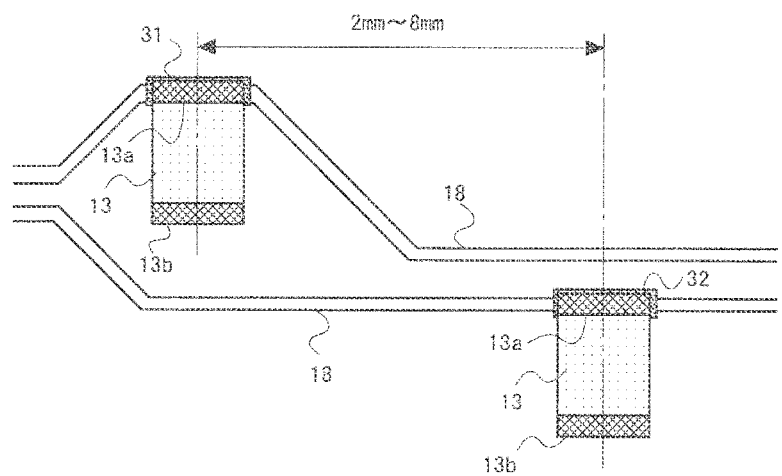

FIGS. 12A and 12B are plan views illustrating a mounting structure for inductors according to a second embodiment of the present disclosure. FIG. 12A illustrates a mounting structure for inductors according to the second embodiment when Bias-T inductors 13 are connected to signal wiring patterns 18 parallel to each other, and FIG. 12B illustrates a mounting structure for inductors according to the second embodiment when the Bias-T inductors 13 are connected to signal wiring patterns 18 having bent portions. In FIGS. 12A and 12B, the same or equivalent parts as those in FIGS. 5A to 7C are denoted by the same reference symbols.

In FIGS. 12A and 12B, a first signal wiring pattern 18 and a second signal wiring pattern 18 formed on a circuit board 15 side by side are formed with a first mounting land 31 formed in a formation direction of the first signal wiring pattern 18 and a second mounting land 32 formed in a formation direction of the second signal wiring pattern 18. A first Bias-T inductor 13 located in the upper part of the figure is mounted on the circuit board 15 with one electrode terminal 13a connected to the first mounting land 31 in a state in which an axial direction C is oriented perpendicular to the first mounting land 31 and the one electrode terminal 13*a* is arranged along the first mounting land 31. A second Bias-T inductor 13 located in the lower part of the figure is mounted on the circuit board 15 with one electrode terminal 13*a* connected to the second mounting land 32 in a state in which an axial direction C is oriented perpendicular to the second mounting land 32 and the one electrode terminal 13*a* is arranged along the second mounting land 32. Other electrode terminals 13*b* of the first and second Bias-T inductors 13 are connected to a power supply line as illustrated in FIG. 4.

Inductance values of both the first and second Bias-T inductors 13 are set to the same value within a range of 0.7 [µH] to 3.3 [µH] that can be used in a PoC signal transmission system configured by using a SerDes circuit as illustrated in FIG. 4. The first and second Bias-T inductors 13 are provided at positions separated by an axial distance of 2 [mm] to 8 [mm].

According to the mounting structure for inductors of the second embodiment, the axial distance between the first Bias-T inductor 13 and the second Bias-T inductor 13 having the same inductance value of 0.7 [µH] to 3.3 [µH] is set to 2 [mm] to 8 [mm], and the one electrode terminals 13*a* are connected to the first mounting land 31 and the second mounting land 32 formed along the first signal wiring pattern 18 and the second signal wiring pattern 18, respectively, so that as in the mounting structure for inductors according to the first embodiment, the Bias-T inductors 13 can be mounted on the circuit board 15 in a state in which the occurrence of cross talk and the stub effects due to the mounting lands 31 and 32 are suppressed, and the signal transmission characteristics are less likely to deteriorate. In addition, the Bias-T inductors 13 can be mounted in an optimum component arrangement in consideration of cross talk, which can contribute to reduction in size of the circuit board 15.

Figure 13A:
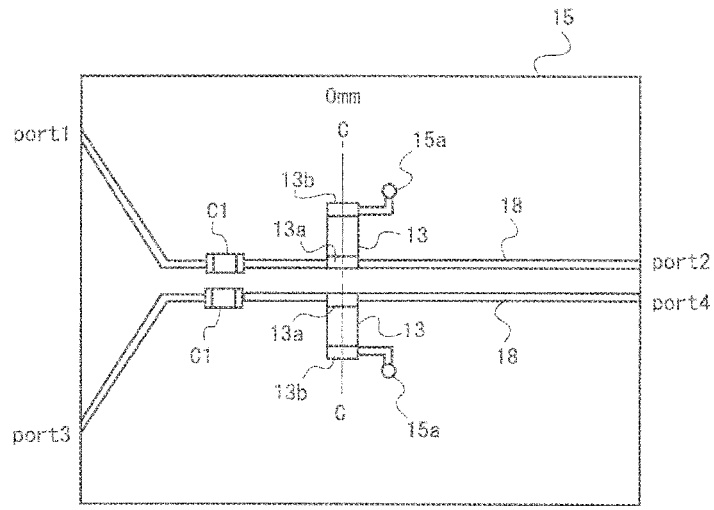
FIGS. 13A-13C are board mounting diagrams when signal transmission characteristics are measured at different axial distances to find a desirable axial distance between the inductors in the mounting structure for inductors according to the second embodiment.
Figure 13B:
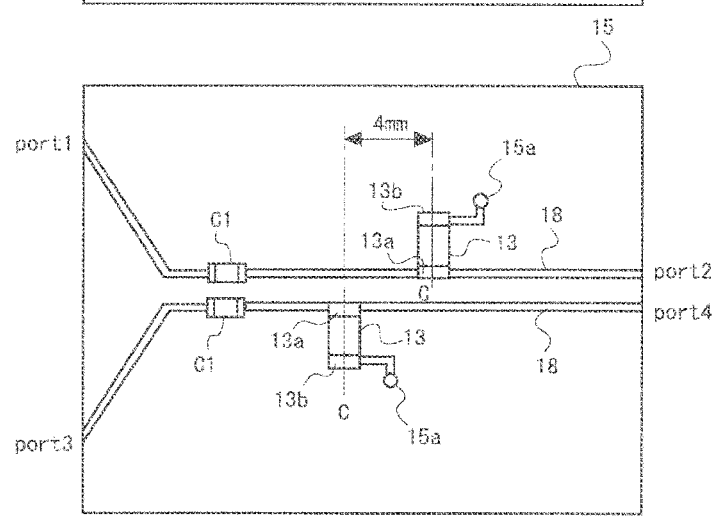
Figure 13C:
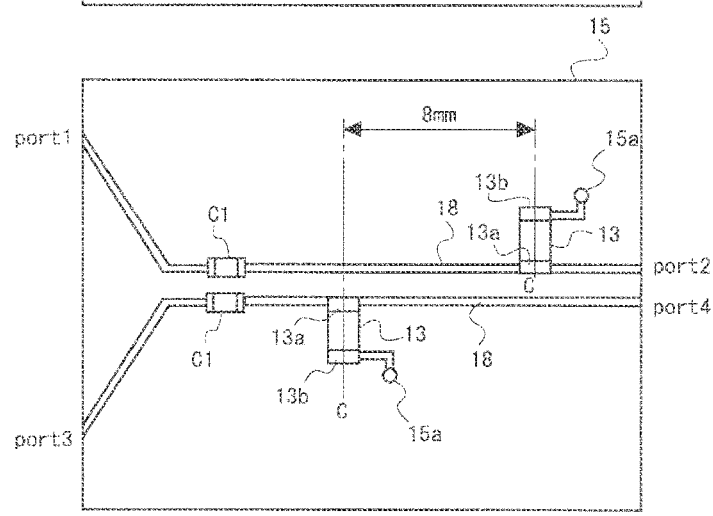

This was confirmed by the following experiment. That is, the signal transmission characteristics were measured for three mounting structures for the inductors in which the signal wiring patterns 18 were formed on the circuit board 15 and the axial distances between the inductors 13 were set to 0 mm, 4 mm, and 8 mm, respectively, as illustrated in FIGS. 13A, 13B, and 13C. The results obtained are illustrated in the graph in FIGS. 14A and 14B.

Each of the inductors 13 illustrated in each of FIGS. 13A, 13B, and 13C has the one terminal 13*a* connected to a mounting land (not illustrated) formed along the signal wiring pattern 18. The other terminal 13*b* is connected to a ground pattern formed in an inner layer of the circuit board 5 via a through-hole 15*a*. Capacitors C1 for cutting off DC power are provided between the one terminals 13*a* of the inductors 13 and ports 1 and 3, respectively.

Figure 14A:
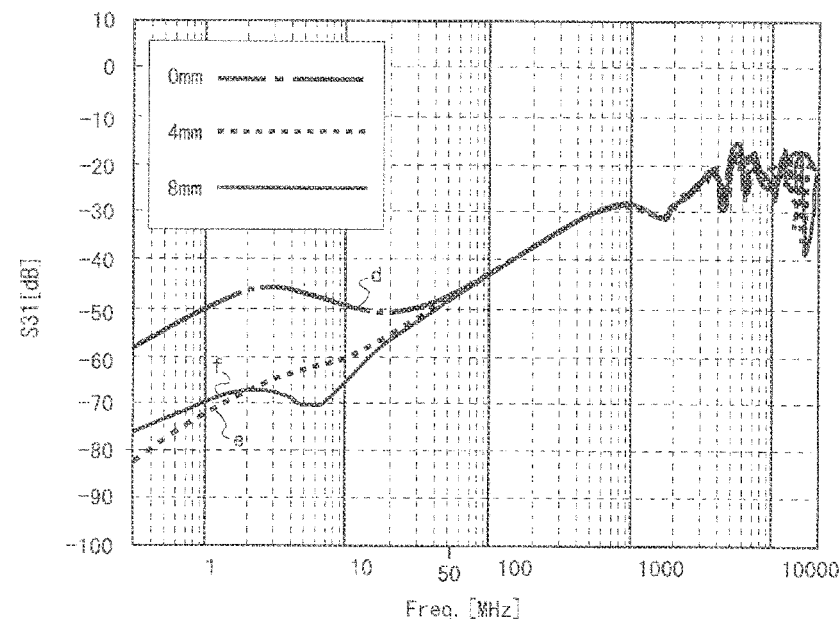
FIG. 14A is a graph showing results of signal transmission characteristics measurements performed at the different axial distances illustrated in FIGS. 13A-13C for the inductors of 1.5 [μH]
Figure 14B:
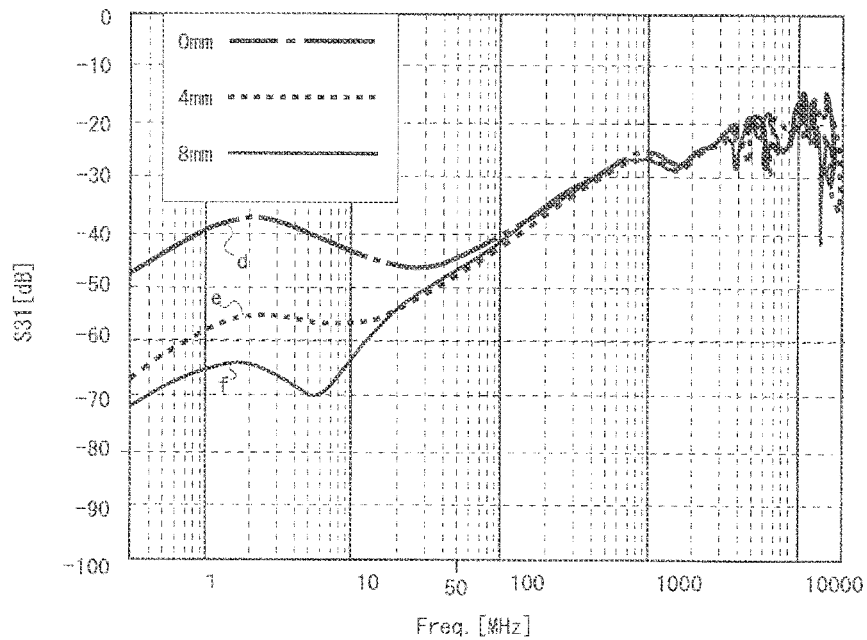
FIG. 14B is a graph showing results of signal transmission characteristics measurements performed at the different axial distances illustrated in FIGS. 13A-13C for the inductors of 2.2 [μH].

The graph in FIG. 14A shows the results of measuring the signal transmission characteristics of the mounting structures illustrated in FIGS. 13A, 13B, and 13C for the inductors 13 having an inductance value of 1.5 [µH], and the graph in FIG. 14B shows the results of measuring the signal transmission characteristics of the mounting structures illustrated in FIGS. 13A, 13B, and 13C for the inductors 13 having an inductance value of 2.2 [µH].

The signal transmission characteristics were measured by measuring a cross talk characteristic S31 for evaluating an amount of signal leakage between the adjacent ports 1 and 3. In each graph, the horizontal axis represents the frequency [MHz], and the vertical axis represents the cross talk characteristic S31 [dB]. In each graph, a characteristic line d of an alternate long and short dash line is a measurement result when the axial distance between the inductors 13 is 0 [mm] as illustrated in FIG. 13A, a characteristic line e of a dotted line is a measurement result when the axial distance between the inductors 13 is 4 [mm] as illustrated in FIG. 13B, and a characteristic line f of a solid line is a measurement result when the axial distance between the inductors 13 is 8 [mm] as illustrated in FIG. 13C.

In the measurement results illustrated in each graph, the measurement results at a frequency of 50 [MHz] or higher are ignored because they were measured not due to cross talk of the inductors 13 but due to cross talk of the circuit board 15 itself, and thus, the measurement results at a frequency of 50 [MHz] or lower are focused on. When the axial distance is set to 4 [mm] or more as illustrated in FIGS. 13B and 13C, the cross talk is −50 [dB] or less at the frequency of 50 [MHz] or less in both the measurement results illustrated in FIG. 14A and the measurement results illustrated in FIG. 14B. When the number of turns of the inductor 13 is increased to increase the inductance value, it is necessary to further increase the axial distance between the inductors 13, and conversely, when the number of turns of the inductor 13 is reduced to lower the inductance value, the axial distance between the inductors 13 can be shortened.

The inductance value that can be used in the PoC signal transmission system configured by using the SerDes circuit is within the range of 0.7 [µH] to 3.3 [µH] as described above. Thus, the axial distance to be taken when the inductance value is 1.5 [µH] is 4 [mm] as described above. Therefore, when the inductance value is 0.7 [µH], which is about half of 1.5 [µH], the axial distance to be taken is 2 [mm], which is half of 4 [mm], and when the inductance value is 3.3 [µH], which is about twice of 1.5 [µH], the axial distance to be taken is 8 [mm], which is twice of 4 [mm]. Therefore, by setting the axial distance to 2 [mm] to 8 [mm], the cross talk between the inductors 13 can be appropriately reduced within the range of the inductance value of 0.7 [µH] to 3.3 [µH], and the above-described operation and effect can be achieved. As a result, according to the mounting structure for inductors of the present embodiment, when designing a PoC signal transmission system using two or more signal lines, the circuit can be optimized at a pre-design stage, thereby eliminating the need to redesign the system.

In the mounting structure for inductors according to the first embodiment described above, even when a fifth Bias-T inductor 13 and a sixth Bias-T inductor 13, which cannot make an angle formed by their axial directions C at 90°±45°, by connecting the fifth Bias-T inductor 13 and sixth Bias-T inductor 13 to a fifth signal wiring pattern 18 and a sixth signal wiring pattern 18 via a fifth mounting land 31 and a sixth mounting land 32, with the inductance value of 0.7 [µH] to 3.3 [µH] and the axial distance of 2 [mm] to 8 [mm], as in the mounting structure for inductors according to the second embodiment, the Bias-T inductors 13 can be mounted on the circuit board 15 in a state in which the occurrence of cross talk between the Bias-T inductors 13 and the stub effects of the mounting lands 31 and 32 are suppressed, and deterioration of signal transmission characteristics is less likely to occur.

That is, in the mounting structure for inductors described above according to the first embodiment and the first modification including the first and second signal wiring patterns 18 or the second modification including the third and fourth signal wiring patterns 18 in addition to the first and second signal wiring patterns 18, the fifth signal wiring pattern 18 and the sixth signal wiring pattern 18 formed side by side with the second signal wiring pattern 18, the fifth mounting land 31 formed in a formation direction of the fifth signal wiring pattern 18, and the sixth mounting land 32 formed in a formation direction of the sixth signal wiring pattern 18 are further formed on the circuit board 15. Then, in that structure, the fifth Bias-T inductor 13 having the inductance value of 0.7 [μH] to 3.3 [μH] and the sixth Bias-T inductor 13 having the inductance value of 0.7 [μH] to 3.3 [μH], which is the same as that of the fifth Bias-T inductor 13, are provided. In this case, the fifth Bias-T inductor 13 is mounted on the circuit board 15 with one electrode terminal 13a connected to the fifth mounting land 31 in a state in which the axial direction C is oriented perpendicular to the fifth mounting land 31 and the one electrode terminal 13a is arranged along the fifth mounting land 31. The sixth Bias-T inductor 13 is provided at a position separated from the fifth Bias-T inductor 13 by an axial distance of 2 [mm] to 8 [mm] and is mounted on the circuit board 15 with one electrode terminal 13a connected to the sixth mounting land 32 in a state in which the axial direction C is oriented perpendicular to the sixth mounting land 32 and the one electrode terminal 13a is arranged along the sixth mounting land 32.

When the mounting structure for inductors is configured in this manner, the similar operation and effect as in the mounting structure for inductors according to the first embodiment are achieved even when there are the fifth Bias-T inductor 13 and the sixth Bias-T inductor 13 in which the angle formed by the axial directions C cannot be 90°±45° in the mounting structure for inductors according to the first embodiment as described above.

As illustrated in FIG. 4, the mounting structure for inductors according to each of the above-described embodiments and modifications is configured on the circuit board 15 on which the serializer circuit and the deserializer circuit to which the plurality of signal lines 12 are connected are formed. This provides a mounting structure for inductors suitable for the Bias-T inductors 13 in the PoC signal transmission system 11 including two or more signal lines 12.

In the above-described embodiments and modifications, as described above, the serializer circuit converts the video signals of the dashboard camera from the parallel signals into the serial signals, and the deserializer circuit converts the video signals of the dashboard camera converted into the serial signals into parallel signals. This provides a mounting structure for inductors suitable for the Bias-T inductors 13 in the automotive system using PoC signal transmission including two or more signal lines 12 that transmits video signals of a dashboard camera.

What is claimed is:

1. A mounting structure for inductors comprising:
    a first signal wiring pattern having a first inclined side inclined at an angle of 22.5° to 67.5° with respect to an extension direction on one side in the extension direction and configured on a circuit board;
    a second signal wiring pattern having a second inclined side inclined at an angle of 22.5° to 67.5° with respect to the extension direction on another side in the extension direction and configured on the circuit board side by side with the first signal wiring pattern;
    a first mounting land configured along the first inclined side with one end being in contact with a corner at which the first signal wiring pattern extending in the extension direction and the first inclined side intersect;
    a first inductor mounted on the circuit board with one electrode terminal connected to the first mounting land such that an axial direction of the first inductor is oriented perpendicular to the first mounting land and the one electrode terminal is arranged along the first mounting land;
    a second mounting land configured along the second inclined side with one end being in contact with a corner at which the second signal wiring pattern extending in the extension direction and the second inclined side intersect; and
    a second inductor mounted on the circuit board in a vicinity of the first inductor with one electrode terminal connected to the second mounting land such that an axial direction of the second inductor is inclined at 90°±45° with respect to the axial direction of the first inductor and is oriented perpendicular to the second mounting land and the one electrode terminal is arranged along the second mounting land.

2. The mounting structure for inductors according to claim 1, wherein
    in the first signal wiring pattern, the first inclined side is inclined at an angle of 45° with respect to the extension direction on the one side in the extension direction,
    in the second signal wiring pattern, the second inclined side is inclined at an angle of 45° with respect to the extension direction on the other side in the extension direction, and
    the axial direction of the second inductor is inclined at 90° with respect to the axial direction of the first inductor.

3. The mounting structure for inductors according to claim 2, wherein
    the circuit board is configured as a double-sided board in which a ground layer is configured as an inner layer and components are mounted on both sides, and
    the first signal wiring pattern, the second signal wiring pattern, the first mounting land, the second mounting land, the first inductor, and the second inductor are on respective both sides of the circuit board.

4. The mounting structure for inductors according to claim 2, further comprising:
    a third signal wiring pattern having a third inclined side inclined at an angle of 22.5° to 67.5° with respect to the extension direction on the one side in the extension direction and on the circuit board side by side with the second signal wiring pattern;
    a fourth signal wiring pattern having a fourth inclined side inclined at an angle of 22.5° to 67.5° with respect to the extension direction on the other side in the extension direction and on the circuit board side by side with the third signal wiring pattern;
    a third mounting land configured along the third inclined side with one end being in contact with a corner at which the third signal wiring pattern extending in the extension direction and the third inclined side intersect;
    a third inductor mounted on the circuit board in a vicinity of the second inductor with one electrode terminal connected to the third mounting land in a state in which an axial direction of the third inductor is inclined at 90°±45° with respect to the axial direction of the second inductor and is oriented perpendicular to the third mounting land and the one electrode terminal is arranged along the third mounting land;
    a fourth mounting land configured along the fourth inclined side with one end being in contact with a corner at which the fourth signal wiring pattern extending in the extension direction and the fourth inclined side intersect; and
    a fourth inductor mounted on the circuit board in a vicinity of the third inductor with one electrode terminal connected to the fourth mounting land such that an axial direction of the fourth inductor is inclined at 90°±45° with respect to the axial direction of the third inductor and is oriented perpendicular to the fourth mounting land and the one electrode terminal is arranged along the fourth mounting land.

5. The mounting structure for inductors according to claim 3, further comprising:
   a third signal wiring pattern having a third inclined side inclined at an angle of 22.5° to 67.5° with respect to the extension direction on the one side in the extension direction and on the circuit board side by side with the second signal wiring pattern;
   a fourth signal wiring pattern having a fourth inclined side inclined at an angle of 22.5° to 67.5° with respect to the extension direction on the other side in the extension direction and on the circuit board side by side with the third signal wiring pattern;
   a third mounting land configured along the third inclined side with one end being in contact with a corner at which the third signal wiring pattern extending in the extension direction and the third inclined side intersect;
   a third inductor mounted on the circuit board in a vicinity of the second inductor with one electrode terminal connected to the third mounting land in a state in which an axial direction of the third inductor is inclined at 90°±45° with respect to the axial direction of the second inductor and is oriented perpendicular to the third mounting land and the one electrode terminal is arranged along the third mounting land;
   a fourth mounting land configured along the fourth inclined side with one end being in contact with a corner at which the fourth signal wiring pattern extending in the extension direction and the fourth inclined side intersect; and
   a fourth inductor mounted on the circuit board in a vicinity of the third inductor with one electrode terminal connected to the fourth mounting land such that an axial direction of the fourth inductor is inclined at 90°±45° with respect to the axial direction of the third inductor and is oriented perpendicular to the fourth mounting land and the one electrode terminal is arranged along the fourth mounting land.

6. The mounting structure for inductors according to claim 2, further comprising:
   a fifth signal wiring pattern and a sixth signal wiring pattern on the circuit board side by side with the second signal wiring pattern;
   a fifth mounting land configured in a direction of the fifth signal wiring pattern;
   a fifth inductor having an inductance value of 0.7 µH to 3.3 µH, the fifth inductor being mounted on the circuit board with one electrode terminal connected to the fifth mounting land in a state in which an axial direction of the fifth inductor is oriented perpendicular to the fifth mounting land and the one electrode terminal is arranged along the fifth mounting land;
   a sixth mounting land configured in a direction of the sixth signal wiring pattern; and
   a sixth inductor having a same inductance value as the inductance value of the fifth inductor of 0.7 µH to 3.3 µH, the sixth inductor being at a position separated from the fifth inductor by an axial distance of 2 mm to 8 mm and mounted on the circuit board with one electrode terminal being connected to the sixth mounting land in a state in which an axial direction of the sixth inductor is oriented perpendicular to the sixth mounting land and the one electrode terminal is arranged along the sixth mounting land.

7. The mounting structure for inductors according to claim 2, wherein
   the circuit board is a circuit board on which a serializer circuit or a deserializer circuit is configured, the serializer circuit or the deserializer circuit being connected to cables through each of which a signal and a DC bias power supply are superimposed and transmitted,
   the signal wiring pattern is a signal wiring pattern that propagates a signal transmitted by each of the cables to the serializer circuit or the deserializer circuit, and
   the one electrode terminal of the inductor is connected to the signal wiring pattern, and another electrode terminal of the inductor is connected to a power supply line that supplies a DC bias power supply to the serializer circuit or the deserializer circuit.

8. The mounting structure for inductors according to claim 1, wherein
   the circuit board is configured as a double-sided board in which a ground layer is configured as an inner layer and components are mounted on both sides, and
   the first signal wiring pattern, the second signal wiring pattern, the first mounting land, the second mounting land, the first inductor, and the second inductor are on respective both sides of the circuit board.

9. The mounting structure for inductors according to claim 8, further comprising:
   a third signal wiring pattern having a third inclined side inclined at an angle of 22.5° to 67.5° with respect to the extension direction on the one side in the extension direction and on the circuit board side by side with the second signal wiring pattern;
   a fourth signal wiring pattern having a fourth inclined side inclined at an angle of 22.5° to 67.5° with respect to the extension direction on the other side in the extension direction and on the circuit board side by side with the third signal wiring pattern;
   a third mounting land configured along the third inclined side with one end being in contact with a corner at which the third signal wiring pattern extending in the extension direction and the third inclined side intersect;
   a third inductor mounted on the circuit board in a vicinity of the second inductor with one electrode terminal connected to the third mounting land in a state in which an axial direction of the third inductor is inclined at 90°±45° with respect to the axial direction of the second inductor and is oriented perpendicular to the third mounting land and the one electrode terminal is arranged along the third mounting land;
   a fourth mounting land configured along the fourth inclined side with one end being in contact with a corner at which the fourth signal wiring pattern extending in the extension direction and the fourth inclined side intersect; and
   a fourth inductor mounted on the circuit board in a vicinity of the third inductor with one electrode terminal connected to the fourth mounting land such that an axial direction of the fourth inductor is inclined at 90°±45° with respect to the axial direction of the third inductor and is oriented perpendicular to the fourth mounting land and the one electrode terminal is arranged along the fourth mounting land.

10. The mounting structure for inductors according to claim 8, further comprising:

a fifth signal wiring pattern and a sixth signal wiring pattern on the circuit board side by side with the second signal wiring pattern;

a fifth mounting land configured in a direction of the fifth signal wiring pattern;

a fifth inductor having an inductance value of 0.7 μH to 3.3 μH, the fifth inductor being mounted on the circuit board with one electrode terminal connected to the fifth mounting land in a state in which an axial direction of the fifth inductor is oriented perpendicular to the fifth mounting land and the one electrode terminal is arranged along the fifth mounting land;

a sixth mounting land configured in a direction of the sixth signal wiring pattern; and a sixth inductor having a same inductance value as the inductance value of the fifth inductor of 0.7 μH to 3.3 μH, the sixth inductor being at a position separated from the fifth inductor by an axial distance of 2 mm to 8 mm and mounted on the circuit board with one electrode terminal being connected to the sixth mounting land in a state in which an axial direction of the sixth inductor is oriented perpendicular to the sixth mounting land and the one electrode terminal is arranged along the sixth mounting land.

11. The mounting structure for inductors according to claim 8, wherein the circuit board is a circuit board on which a serializer circuit or a deserializer circuit is configured, the serializer circuit or the deserializer circuit being connected to cables through each of which a signal and a DC bias power supply are superimposed and transmitted, the signal wiring pattern is a signal wiring pattern that propagates a signal transmitted by each of the cables to the serializer circuit or the deserializer circuit, and the one electrode terminal of the inductor is connected to the signal wiring pattern, and another electrode terminal of the inductor is connected to a power supply line that supplies a DC bias power supply to the serializer circuit or the deserializer circuit.

12. The mounting structure for inductors according to claim 1, further comprising:

a third signal wiring pattern having a third inclined side inclined at an angle of 22.5° to 67.5° with respect to the extension direction on the one side in the extension direction and on the circuit board side by side with the second signal wiring pattern;

a fourth signal wiring pattern having a fourth inclined side inclined at an angle of 22.5° to 67.5° with respect to the extension direction on the other side in the extension direction and on the circuit board side by side with the third signal wiring pattern;

a third mounting land configured along the third inclined side with one end being in contact with a corner at which the third signal wiring pattern extending in the extension direction and the third inclined side intersect;

a third inductor mounted on the circuit board in a vicinity of the second inductor with one electrode terminal connected to the third mounting land in a state in which an axial direction of the third inductor is inclined at 90°±45° with respect to the axial direction of the second inductor and is oriented perpendicular to the third mounting land and the one electrode terminal is arranged along the third mounting land;

a fourth mounting land configured along the fourth inclined side with one end being in contact with a corner at which the fourth signal wiring pattern extending in the extension direction and the fourth inclined side intersect; and a fourth inductor mounted on the circuit board in a vicinity of the third inductor with one electrode terminal connected to the fourth mounting land such that an axial direction of the fourth inductor is inclined at 90°±45° with respect to the axial direction of the third inductor and is oriented perpendicular to the fourth mounting land and the one electrode terminal is arranged along the fourth mounting land.

13. The mounting structure for inductors according to claim 12, further comprising:

a fifth signal wiring pattern and a sixth signal wiring pattern on the circuit board side by side with the second signal wiring pattern;

a fifth mounting land configured in a direction of the fifth signal wiring pattern;

a fifth inductor having an inductance value of 0.7 μH to 3.3 μH, the fifth inductor being mounted on the circuit board with one electrode terminal connected to the fifth mounting land in a state in which an axial direction of the fifth inductor is oriented perpendicular to the fifth mounting land and the one electrode terminal is arranged along the fifth mounting land;

a sixth mounting land configured in a direction of the sixth signal wiring pattern; and a sixth inductor having a same inductance value as the inductance value of the fifth inductor of 0.7 μH to 3.3 μH, the sixth inductor being at a position separated from the fifth inductor by an axial distance of 2 mm to 8 mm and mounted on the circuit board with one electrode terminal being connected to the sixth mounting land in a state in which an axial direction of the sixth inductor is oriented perpendicular to the sixth mounting land and the one electrode terminal is arranged along the sixth mounting land.

14. The mounting structure for inductors according to claim 12, wherein the circuit board is a circuit board on which a serializer circuit or a deserializer circuit is configured, the serializer circuit or the deserializer circuit being connected to cables through each of which a signal and a DC bias power supply are superimposed and transmitted, the signal wiring pattern is a signal wiring pattern that propagates a signal transmitted by each of the cables to the serializer circuit or the deserializer circuit, and the one electrode terminal of the inductor is connected to the signal wiring pattern, and another electrode terminal of the inductor is connected to a power supply line that supplies a DC bias power supply to the serializer circuit or the deserializer circuit.

15. The mounting structure for inductors according to claim 1, further comprising:

a fifth signal wiring pattern and a sixth signal wiring pattern on the circuit board side by side with the second signal wiring pattern;

a fifth mounting land configured in a direction of the fifth signal wiring pattern;

a fifth inductor having an inductance value of 0.7 μH to 3.3 μH, the fifth inductor being mounted on the circuit board with one electrode terminal connected to the fifth mounting land in a state in which an axial direction of the fifth inductor is oriented perpendicular to the fifth mounting land and the one electrode terminal is arranged along the fifth mounting land;

a sixth mounting land configured in a direction of the sixth signal wiring pattern; and a sixth inductor having a same inductance value as the inductance value of the fifth inductor of 0.7 μH to 3.3 μH, the sixth inductor being at a position separated from the fifth inductor by an axial distance of 2 mm to 8 mm and mounted on the circuit board with one electrode terminal being connected to the sixth mounting land in a state in which an axial direction of the sixth inductor is oriented perpendicular to the sixth mounting land and the one electrode terminal is arranged along the sixth mounting land.

16. The mounting structure for inductors according to claim 15, wherein the circuit board is a circuit board on which a serializer circuit or a deserializer circuit is configured, the serializer circuit or the deserializer circuit being connected to cables through each of which a signal and a DC bias power supply are superimposed and transmitted, the signal wiring pattern is a signal wiring pattern that propagates a signal transmitted by each of the cables to the serializer circuit or the deserializer circuit, and the one electrode terminal of the inductor is connected to the signal wiring pattern, and another electrode terminal of the inductor is connected to a power supply line that supplies a DC bias power supply to the serializer circuit or the deserializer circuit.

17. The mounting structure for inductors according to claim 1, wherein the circuit board is a circuit board on which a serializer circuit or a deserializer circuit is configured, the serializer circuit or the deserializer circuit being connected to cables through each of which a signal and a DC bias power supply are superimposed and transmitted, the signal wiring pattern is a signal wiring pattern that propagates a signal transmitted by each of the cables to the serializer circuit or the deserializer circuit, and the one electrode terminal of the inductor is connected to the signal wiring pattern, and another electrode terminal of the inductor is connected to a power supply line that supplies a DC bias power supply to the serializer circuit or the deserializer circuit.

18. The mounting structure for inductors according to claim 17, wherein the serializer circuit converts video signals of a dashboard camera from parallel signals into serial signals, and the deserializer circuit converts the video signals of the dashboard camera converted into the serial signals into parallel signals.

19. A mounting structure for inductors comprising:

a first signal wiring pattern and a second signal wiring pattern on a circuit board side by side;

a first mounting land configured in a direction of the first signal wiring pattern;

a first inductor having an inductance value of 0.7 μH to 3.3 μH, the first inductor being mounted on the circuit board with one electrode terminal connected to the first mounting land in a state in which an axial direction of the first inductor is oriented perpendicular to the first mounting land and the one electrode terminal is arranged along the first mounting land;

a second mounting land configured in a direction of the second signal wiring pattern; and a second inductor having a same inductance value as the inductance value of the first inductor of an inductance value within a range of 0.7 μH to 3.3 μH, the second inductor being at a position separated from the first inductor by an axial distance of 2 mm to 8 mm and mounted on the circuit board with one electrode terminal connected to the second mounting land in a state in which an axial direction of the second inductor is oriented perpendicular to the second mounting land and the one electrode terminal is arranged along the second mounting land.

20. The mounting structure for inductors according to claim 19, wherein the circuit board is a circuit board on which a serializer circuit or a deserializer circuit is configured, the serializer circuit or the deserializer circuit being connected to cables through each of which a signal and a DC bias power supply are superimposed and transmitted, the signal wiring pattern is a signal wiring pattern that propagates a signal transmitted by each of the cables to the serializer circuit or the deserializer circuit, and the one electrode terminal of the inductor is connected to the signal wiring pattern, and another electrode terminal of the inductor is connected to a power supply line that supplies a DC bias power supply to the serializer circuit or the deserializer circuit.

* * * * *